United States Patent [19]
Karavakis et al.

[11] Patent Number: 5,597,470
[45] Date of Patent: Jan. 28, 1997

[54] METHOD FOR MAKING A FLEXIBLE LEAD FOR A MICROELECTRONIC DEVICE

[75] Inventors: Konstantine Karavakis, Cupertino; Thomas H. DiStefano, Monte Sereno; Joseph Fjelstad, Sunnyvale, all of Calif.

[73] Assignee: Tessera, Inc., San Jose, Calif.

[21] Appl. No.: 491,809

[22] Filed: Jun. 18, 1995

[51] Int. Cl.[6] .................................... C25D 5/02
[52] U.S. Cl. ................ 205/118; 205/122; 205/123; 216/14; 216/15; 216/20
[58] Field of Search .................. 216/15, 14, 20; 205/122, 125, 123, 118

[56] References Cited

U.S. PATENT DOCUMENTS

| | | | |
|---|---|---|---|
| 3,162,512 | 12/1964 | Robinson | 428/670 |
| 3,390,308 | 6/1968 | Marley | 361/705 |
| 3,480,412 | 11/1969 | Duffek, Jr. et al. | 428/601 |
| 3,684,464 | 8/1972 | Happ et al. | 428/614 |
| 3,781,596 | 12/1973 | Galli et al. | 361/751 |
| 4,000,842 | 1/1977 | Burns | 228/180.21 |
| 4,052,787 | 10/1977 | Shaheen | 29/827 |
| 4,139,434 | 2/1979 | Dugan | 216/18 |
| 4,188,438 | 2/1980 | Burns | 428/209 |
| 4,463,060 | 7/1984 | Updegraff | 428/669 |
| 4,529,667 | 7/1985 | Shiga et al. | 428/646 |
| 4,549,043 | 10/1985 | Kalubowila et al. | 174/133 R |
| 4,707,724 | 11/1987 | Suzuki et al. | 257/677 |
| 4,842,662 | 6/1989 | Jacobi | 156/73.1 |
| 4,935,312 | 6/1990 | Nakayama et al. | 428/642 |
| 5,008,997 | 4/1991 | Phy | 29/827 |
| 5,172,570 | 7/1992 | Steitz | 228/103 |
| 5,294,039 | 3/1994 | Pai et al. | 228/180.22 |
| 5,317,479 | 5/1994 | Pai et al. | 361/773 |
| 5,384,204 | 1/1995 | Yumoto et al. | 428/626 |

*Primary Examiner*—Donald R. Valentine
*Assistant Examiner*—Brendan Mee
*Attorney, Agent, or Firm*—Lerner, David, Littenberg, Krumholz & Mentlik

[57] ABSTRACT

A method for providing a flexible lead for a microelectronic device. A lead such as nickel or a nickel alloy is provided in elongated strips on a base material such as copper, which in turn overlies a dielectric sheet. The base material is etched from beneath bond regions of the lead material strips and a cover layer of a bondable material such as gold selectively provided around the lead material strips. The lead material strips act as plating mandrels, and allow rapid deposition of the cover material. A detachment area may be provided in each lead so that the leads may be detached and displaced within a bonding window in the dielectric sheet for attachment to chip contacts.

27 Claims, 9 Drawing Sheets

METHOD FOR MAKING A FLEXIBLE LEAD FOR A MICROELECTRONIC DEVICE

FIELD OF THE INVENTION

The present invention relates generally to the packaging of microelectronic devices, and more particularly to a method of making of a flexible lead for a semiconductor chip package.

BACKGROUND OF THE INVENTION

Many factors contribute to the cost of manufacturing semiconductor chip packages. Because the development and high volume implementation of new semiconductor chip packages is typically a very expensive and involved process, one important factor is whether the new invention can be implemented using the existing packaging equipment infrastructure or whether specialized equipment must be created in order to practice the invention. If existing packaging equipment may be adapted to manufacture a new chip package, a large amount of money may be saved in implementing the new package. Further, many of the technological challenges in implementing high volume manufacture of a new packaging invention may be more easily overcome if existing equipment or processes can be changed to manufacture the new invention. This is because existing equipment and processes have known limitations within which the new packaging problems can be solved; while the limitations of new equipment or processes may not be so easily recognized or appreciated.

A packaging solution broadly accepted within the semiconductor industry is to use a tape automated bonding ("TAB") process to interconnect the contacts on a semiconductor chip to a package or lead frame. In a typical TAB process (as shown in FIGS. 1A–D), portions of a flexible dielectric supporting tape 10 are removed by a punching operation to create an opening 20. A layer of rolled and annealed copper 30 is then laminated to the tape 10 by adhesive 40. A first dielectric photo-resist 50 is then selectively applied to the top surface of the copper layer 30 and a second dielectric photoresist 60 is applied to the bottom exposed surfaces of the tape 10 and the copper layer 30. The exposed copper layer 10 is then etched so that only the copper leads 35 remain. The dielectric resist 50/60 is then removed leaving a central opening where the central tape portion 70 was positioned before it was unattached due to the etching step. The copper leads 35 thus extend into the central opening of the tape 10 such that the innermost ends of the leads 35 are self-supporting and cantilevered therein. The central opening is further generally slightly larger than a semiconductor chip to be attached thereto. The innermost ends of the leads 35 are arranged side by side at a spacing corresponding to the spacing of the contacts on the chip. The chip is then centered within the opening so that the innermost ends of the leads extend over the front or contact bearing surface on the chip. The innermost ends of the leads are then either gang bonded or single point bonded to the contacts of the chip using ultrasonic, thermosonic or thermocompression bonding techniques, forming and defining what is referred to as the inner lead bond ("ILB"). One early bumpless TAB solution is disclosed in U.S. Pat. No. 3,390,308 issued to Marley in which a TAB-like lead structure for a multi-chip circuit assembly has cantilevered ribbon leads which are made flexible by having a thin cross section in an attempt to minimize the stress on the lead/contact bonds due to the differential thermal expansions and contractions between a chip and a heat sink, as described more fully below.

TAB and TAB leads have several known limitations, such as producing a chip package which has leads that are "fanned out" from the chip contacts to the periphery of the package creating a total chip package which is appreciably larger than the operational chip itself. Another known TAB problem is alignment and bonding of the leads to their respective chip contacts to form the ILBs. Because TAB leads are essentially free-floating, cantilevered conductive strips it is very difficult to rapidly and accurately bond a TAB lead to a particular chip contact while ensuring that the lead will not electrically short with adjacent leads or adjacent chip contacts. This is especially true with fine pitch (small center-to-center distances) TAB leads.

Further, TAB leads are typically comprised of copper because copper is readily available, easily processed by plating or etching, inexpensive, can be made to be pliable and yet still has acceptable conductivity. However, an oxidation film can form on the surface of copper leads over time thereby inhibiting both the conductivity of the lead and the strength of the bond between the lead and the chip contact. Compatibility of materials has also been a problem. For example, copper leads do not generally bond well with a chip contacts, which are typically made of aluminum or an aluminum alloy. Because of these material incompatibilities, boundary layers between the copper leads and the aluminum chip contacts have been used. One example of such a boundary layer is to use a gold "bump" typically placed between the ILB of the TAB lead and its respective chip contact. The bumps are either attached to each of the chip contacts or to the ends of the inner leads. Another solution, U.S. Pat. No. 4,188,438 issued to Burns, discloses the use of a thin anti-oxidant coating on copper TAB leads to obtain better copper to copper thermocompression bonds to chip bonding bumps. The anti-oxidant coating is used to inhibit the formation of an oxide layer from forming on the copper leads and the copper bonding pads; however, the anti-oxidant layer is also thin enough to allow a thermocompression bond to be obtained between the copper lead and the bonding bumps therethrough.

Incompatible lead and lead boundary layer materials can also cause problems. As stated above, TAB leads are typically comprised of copper for a variety of reasons. When a boundary layer is placed onto the lead to stop oxidation, one must be careful to use a boundary material which has an acceptable conductivity while at the same time ensuring that the lead material will not diffuse into the boundary material under the high temperatures used in chip packaging. Such diffusion generally creates a phenomenon called Kirkendahl Voiding (voids created at the boundary of two metals having different interdiffusion coefficients). These voids along the boundary of the two metals cause bond degradation between the metal layers and brittleness of the lead itself. For example, U.S. Pat. No. 4,842,662 issued to Jacobi describes another bumpless TAB solution, similar to the Marley ('308) patent described above. In the '662 patent the TAB lead is bent down toward the contact on a semiconductor chip preferably using a copper lead having a gold layer plated therearound. However, such copper-gold lead boundaries have been known to become unreliable because of the voiding problem. U.S. Pat. No. 5,384,204 issued to Yumoto et al. attempts to address this same issue with copper-tin TAB leads. This patent discloses forming at least one barrier layer between the copper lead and the tin layer such that the copper does not diffuse into the tin when the lead is bonded to a gold bumped semiconductor chip contact using a high temperature gold-tin eutectic bond process.

A still further known TAB package problem is compensating for the expansion rate differential ("thermal mismatch") between the chip and its supporting substrate during the heating and cooling cycles of the chip ("thermal cycling"). TAB leads are typically used internally in a chip package to interconnect the chip contacts to a lead frame. The combination is then generally encased in rigid plastic or epoxy such that the lead frame extends beyond the boundary of the encasement to a circuitized supporting substrate. Because of the length of the individual lead frame arms, the lead frame compensates for the effects of the thermal cycling by allowing the arms to bend and twist as the chip heats and cools. However, this creates a larger total chip package than is desired in many present day applications.

Despite the substantial time and effort devoted heretofore to the problems associated with providing an inexpensive yet reliable package lead, there are still unmet needs for improvements in such semiconductor chip package structures and methods.

SUMMARY OF THE INVENTION

The present invention provides a method of fabrication of a flexible lead for a semiconductor chip package which solves the aforementioned problems in the art. Thus, one aspect of the present invention provides a method of fabricating leads on a flexible dielectric layer having first and second major surfaces and having a sheet of a conductive base material attached to the first major surface. Methods according to this aspect of the present invention desirably include the steps of providing elongated strips of a lead material on the sheet of base material and then etching the base material after providing the strips so as to remove the base material from beneath the strips of lead material in a bond region of each such strip, leaving each strip attached to the base material at opposite ends of the bond region. The lead material strips may be provided either in an additive process, in which the lead material is selectively deposited in lead areas on the sheet of conductive material, or in a subtractive process in which the lead material is provided as a sheet overlying the conductive base metal sheet and then selectively etched to leave the strips. In either case, the lead material strips may act as an etch mask during etching of the conductive sheet or base metal. A method according to this aspect of the present invention desirably includes the further step of plating a layer of a cover material onto each strip of lead material in the bond region. The method may further include the step of providing a bonding window extending through the dielectric sheet in registration with the bond regions of the strips. The bonding window desirably is provided prior to the step of etching the base metal sheet, so that the base metal is exposed to the etchant through the bonding window. Thus, after etching the bond region of each lead may consist essentially of the elongated strip of lead material, bridging across the bonding window.

During plating of the cover layer, the lead material strips act as plating mandrels. As further discussed below, use of the lead material strips as such plating mandrels permits formation of a composite lead including the lead material and cover layers in considerably less plating time than would be required to bill a comparable lead by the cover material alone. Preferred methods according to this aspect of the invention can use plating times short enough to facilitate practical processing on conventional equipment commonly used to fabricate ordinary TAB tapes. The cover layer and lead materials preferably are selected to provide a bond region which is flexible, fatigue-resistant and readily bondable to a contact of semiconductor chip or other device. Preferably, the cover material is a metal such as gold which is highly flexible, ductile and readily bondable. Because the lead material is covered by a cover material, it need not be readily bondable, and may be selected for its mechanical properties. The cover material desirably is applied selectively, only on the bond regions of the leads. Thus, those portions of the leads remote from the bond regions may include the base metal of the conductive sheet. This can provide significant cost savings, particularly where the cover layer material is a precious metal such as gold. The resulting lead structure provides the flexibility and bondability of a lead fabricated entirely from a precious metal, but at a lower cost.

The foregoing and other objects and advantages of the present invention will be better understood from the following Detailed Description of a Preferred Embodiment, taken together with the attached Figures.

DETAILED DESCRIPTION THE PREFERRED EMBODIMENTS

FIGS. 2 A–G show a preferred method of fabricating a lead structure for a semiconductor lead package, according to the present invention. As shown in FIG. 2A, portions are removed from a flexible, dielectric layer 100 to create bonding windows 105, typically by a mechanical punching operation. The dielectric layer 100 is then laminated to a sheet 110 of a conductive base material by an adhesive layer 120 generally about 5 to 15 μm thick. Typically, the dielectric layer 100 is a thin dielectric film layer, preferably comprised of a flexible, but substantially inextensible, film circuit element, formed from a polymeric material such as polyimide with an approximate thickness of between 25 μm and 100 μm. The conductive sheet 110 is typically an 18 μm to 36 μm thick sheet of rolled and annealed copper.

Figure 1A:
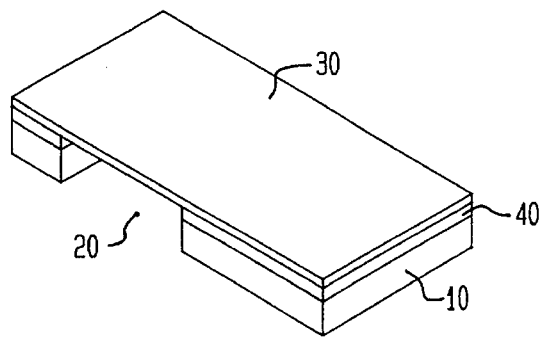
FIG. 1A through FIG. 1D show a perspective view of a typical prior art TAB process.
Figure 1B:
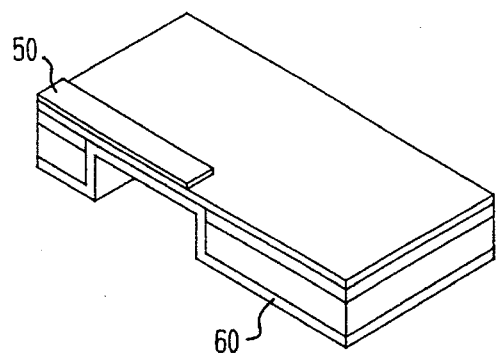
Figure 1C:
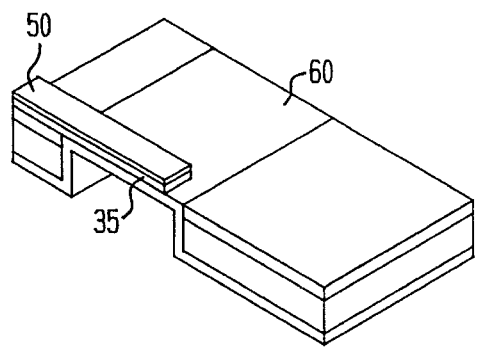
Figure 1D:
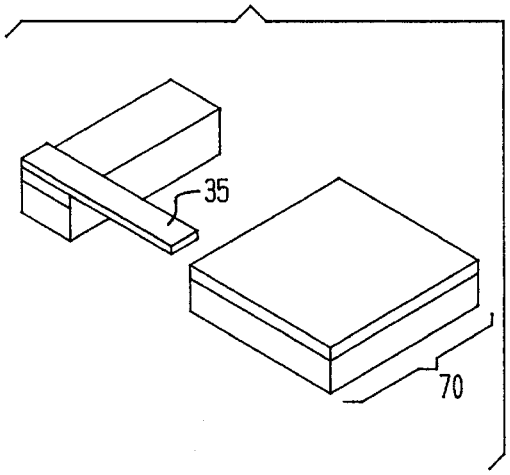
Figure 2A:
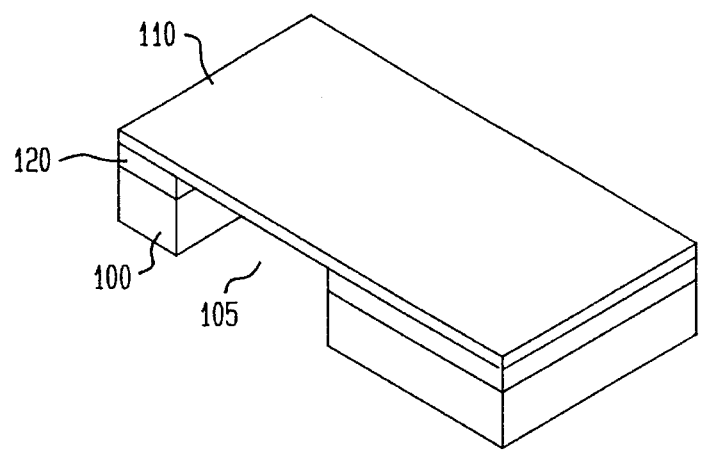
FIG. 2A through FIG. 2G show a perspective view of components being processed at successive stages of a method according to one embodiment of the invention.
Figure 2B:
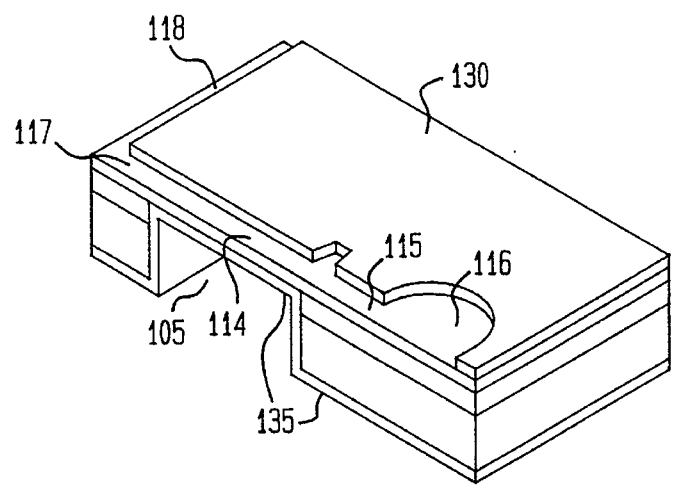

In FIG. 2B, a dielectric photoresist material 130 is selectively applied to the top surface of the conductive sheet 110 remote from the dielectric layer 100. A further dielectric resist material 135 is applied to the bottom surface of dielectric layer 100, and covers the bottom surface of conductive sheet 110 in the bonding window 105. Portions of the top photoresist 130 are then selectively exposed, developed and selectively removed using standard lithographic techniques, leaving portions covering conductive sheet 110 and uncovered regions defining elongated, strip-like regions each including an elongated bond region 114 extending across the bonding window 105, a first end area 115 extending away from one end of each bond region on one side of the bonding window and a second end area 117 extending away from the bond region on the opposite side of the bonding window. Although only one such strip is visible in FIG. 2, numerous strips are provided in a side-by-side array. The regions uncovered by the photoresist include terminal areas 116 remote from the bonding window, each such terminal area being connected to the bond region 114 of a strip by the first end area 115 of the strip. The uncovered areas further include a bus region 118 extending transversely to the strips. Bus region 118 is connected to the second end regions of all the strips.

Figure 2C:
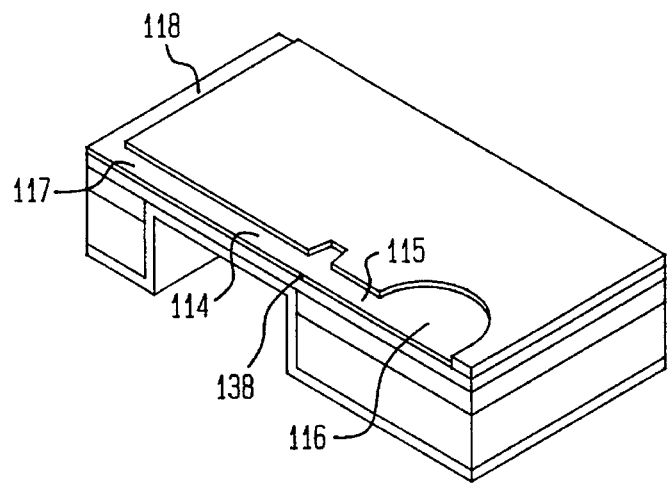

Lead material 138 is next plated atop and within the defined areas of the conductive sheet, as shown in FIG. 2C, so that the lead material covers the conductive sheet in bond regions 114, end regions 115 and 117, terminal areas 116 and bus region 118. Typically, the lead material will be plated to a uniform thickness of about 5 μm to 10 μm, and preferably to a thickness of 6 μm to 9 μm. As discussed below, the lead material is later covered by a cover material such as gold or another bondable metal. The lead material 138 is comprised of a metal which will not diffuse rapidly into the cover material so that intermetallic crystals will not embrittle the cover material during use and will not cause reliability problems during thermal cycling of a finished semiconductor chip package. Preferably, nickel is used as the lead material 138 due to its widespread availability, relatively low cost and resistance to various etchants. If plated properly, nickel is also a ductile metal. However, even normally brittle metals can be used as lead materials if they are made thin enough so that they have strength while also having flexibility. Examples of acceptable lead metals include nickel, palladium, titanium, nickel, cobalt, chromium, gold, zinc and alloys and combinations thereof. Nickel, nickel-palladium alloys, nickel-titanium alloys, gold, chromium-gold alloys, and palladium are particularly preferred. Shape memory alloys referred to as superplastic alloys, can be employed. These alloys can sustatin exraordinarily large strains (in some cases up to about 10%) without fatigue failure. These materials can be selected to have transition temperatures either above or below the normal service temperature of the completed device. These materials typically are not well suited to electronic bonding operations and have relatively low electrical conductivity. However, when these materials are coated with a suitable cover material having high conductivity and good bondability, the resulting composite lead combines the mechanical properties of the shape memory materials with the electrical and bonding properties of the cover material. Optionally, a gold flash layer (not shown), typically about 0.2 μm to 0.5 μm, may be plated atop the lead material 138 to ensure the reliability of any subsequent electrical connection to the terminal 170, as described below.

Figure 2D:
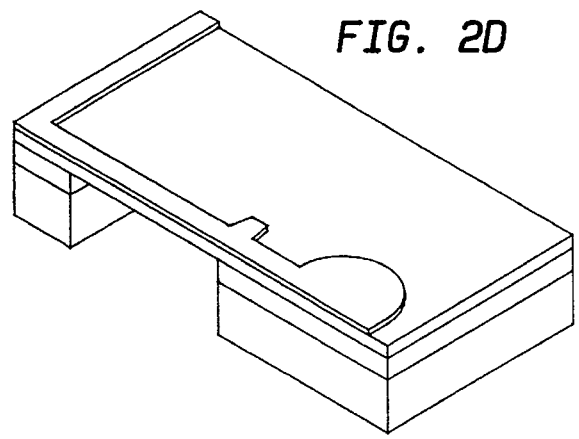
Figure 2E:
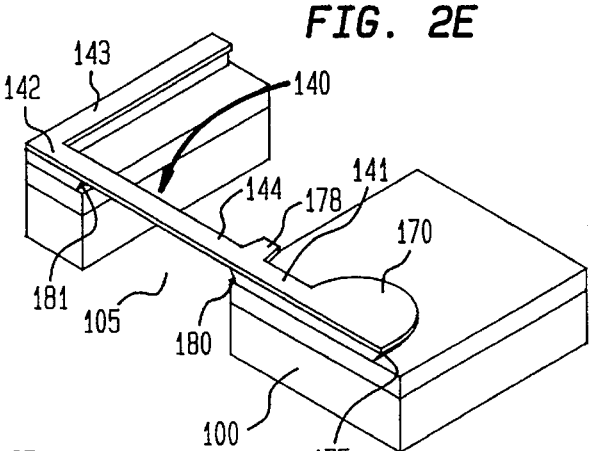

In FIGS. 2D and 2E, the top and bottom resists 130 and 135 are removed by a stripping solution and the conductive sheet is then etched, typically using an etchant solution which removes the base material in the conductive sheet but either does not remove the lead material or removes it much more slowly than it removes the conductive sheet. Thus, the lead material acts as a etch mask so that the etchant removes the portions of the base metal in the conductive sheet not protected by the lead material. Those portions of the base metal remote from the bond window and covered by the lead material remain after this etching step, leaving conductive features including terminals 170 and a conductive bus on the dielectric layer 100. Typically, the etchant will also slightly subetch the conductive sheet at a point around the periphery of the lead material, shown at 175. However, the etch process may be controlled so as to minimize this effect. Those portions of the base metal beneath bond regions 114 are exposed to the etchant through the bonding window 105, so that the base metal is removed from beneath the bond region of each lead metal strip. This etching step will also sub-etch the conductive sheet material 110 past the boundary of the bonding window 105 above the dielectric layer 100 providing removed areas 180/181 devoid of base metal at opposite ends of each bond region, between the lead material and the dielectric layer. The etching step thus forms continuous leads 140 extending across the bonding window 105 from a central portion of the tape to an outer portion and are secured to either side thereof. In other words, a first end region 141 of each lead will be adhered to the dielectric layer 100 and will end in a terminal 170, while a second end region 142 of each lead will be adhered to the dielectric layer on the opposite side of the bonding window 105 and will terminate at bus 143. All of these features will include the base metal, whereas the bond region 144 of the lead, extending across the bond region, includes only the lead metal.

As described above, the lead material 138 is preferably extended to create the terminal 170, which will eventually be used to connect the finished package to a circuitized substrate with a solder ball or the like. If the terminal 170 is created in this way, the lead material 138 will protect the terminal 170 thereunder from oxidation. However, if cost is an issue, the lead end regions and terminals beyond the boundary of the bonding windows may be protected during the etching step by the hardened portions of the dielectric photoresist material 130 so that they will not be etched and so that the lead material 138 may be more selectively used.

Figure 2F:
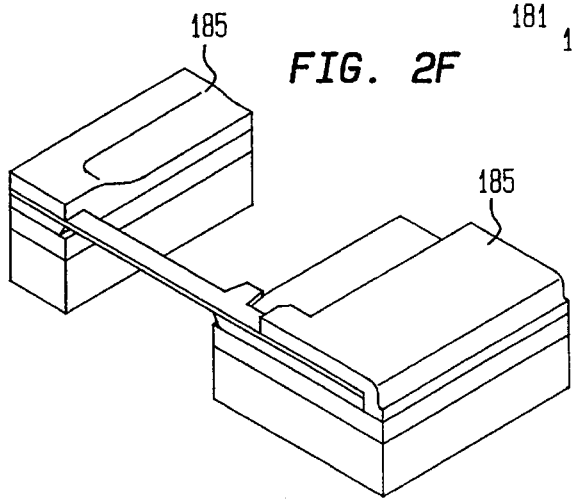
Figure 2G:
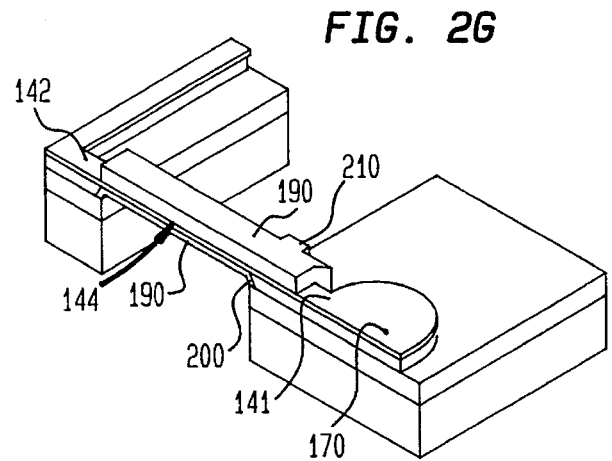

In FIGS. 2F and 2G, another dielectric photo-resist 185 is selectively applied to the lead bearing surface of the dielectric layer 100 and a selective layer 190 of a bondable cover material is plated around the lead material in the bond region 144 of each lead. This may be accomplished by electroplating, using bus 143 to carry the electroplating current to all of the leads. The bus is electrically continuous with all of the bond regions. Because the lead material will not form brittle intermetallic crystals with the cover layer by diffusion to any substantial extent, there are no substantial questions of embrittlement of the bond region within the bonding window 105. The cover layer desirably is formed from a metal which can be readily bonded to the contacts of a semiconductor chip or other microelectronic device using processes such as thermosonic, thermocompression or ultrasonic bonding. Metals such as gold, silver, platinum, palladium, and alloys and combinations thereof are preferred for use as the cover layer 190 is comprised of 99.9% pure gold and is plated to a uniform thickness of about 1 μm to 10 μm, and preferably about 2 μm to 5 μm over all exposed surfaces of the lead material in the bond region. Typically, the cover layer is also plated in overlap area 210 extending past the boundary of the bonding window 105 onto the lead's first end region 141 to relieve stress in the lead when it is eventually detached and bonded to a chip contact, as described in more detail below. The cover layer 190 is also plated into the removed area 180 closest to the terminal 170, at the juncture of the bond region 144 and the first end region 141 forming a butt joint 200 between the cover layer 190 and the base metal in the first end region. This butt joint enhances the thermal cycling resistance of the bonded lead (as described below) and protects the base metal from subsequent corrosion. A butt joint may be prevented from forming in the opposite removed area 181 at the juncture of the bond region and the second end region 142, by covering the under side of the lead 140 with dielectric resist. This will aid in defining a detachment area for subsequent breaking of the lead, as described below.

After formation of the cover layer, resist 185 may be removed. The leads may be plated again with a thin layer of gold or another oxidation-resistant metal so as to cover the exposed base metal at the edges of the lead end regions 141 and 142 and at terminals 170 so that the only remaining possible contamination path to the conductive sheet material is at the boundary of the cover layer 190 and the dielectric layer 100. A solder mask (not shown) is next typically applied to the lead bearing surface of the dielectric layer 100 to cover the leads except at the terminal 170 at the bond regions. The solder mask protects the leads from electrical shorting and corrosion. A solder ball, plated bump, etc. may be attached thereto.

As further discussed below, each lead can be bonded to a contact on a semiconductor chip or other element by engaging the lead with a bonding tool and forcing the lead downwardly so as to detach the bond region 144 from the second end region 142 and hence from the dielectric layer 100, and so as to force the bond region downwardly through bonding window 105 to the contact. Detachment and bonding of these improved leads is described in detail below. When the bond region 144 of each lead is detached from the dielectric layer, bent into the bonding window and bonded to a chip contact, the gold butt-joint 200 and the over-lap gold area 210 both enhance the fatigue resistance of the bonded lead by ensuring that the lead first extend a small horizontal distance outward into the bonding window 160 somewhat parallel to the dielectric layer 100 before extending downward toward the chip contact.

FIGS. 3 A–G show an alternate method of fabricating a lead structure for a semiconductor lead package, according to the present invention wherein the bonding window of the dielectric layer is formed later in the process. As shown in FIG. 3A, a dielectric sheet or film 100' is laminated to a conductive sheet 110' of base material of the type discussed above using a thin film of adhesive 120', as in the previous embodiment. While this embodiment involves lamination of the conductive sheet 110', it should be noted that the conductive sheet 110' may also be coupled to the dielectric sheet or film 100' without the adhesive layer by industry known sputtering or plating processes.

Figure 3A:
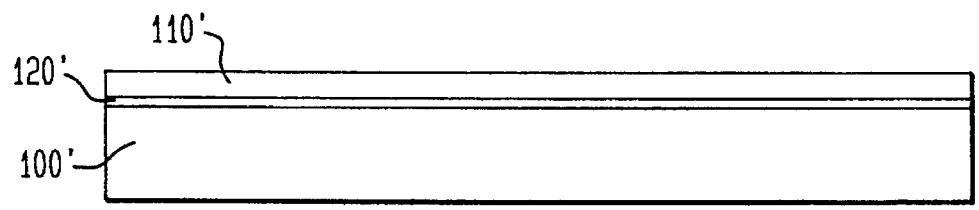
FIG. 3A through FIG. 3G show a side views of components at successive stages of a process according to an alternate embodiment of the present invention.
Figure 3B:
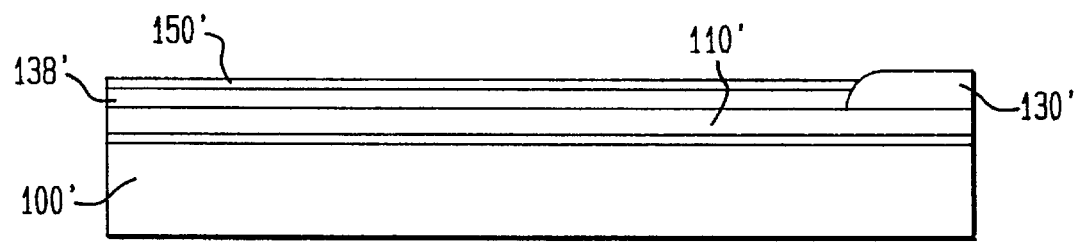

In FIG. 3B, a dielectric photoresist material 130' is applied to the top surface of the conductive sheet 110' to define lead and terminal portions, and selectively removed as described in relation to FIG. 2. A lead material 138' is then selectively plated within the defined areas of the atop conductive sheet. An optional flash layer 150' of a corrosion resistant metal such as gold, as described above, is shown in FIG. 3 and may be plated atop lead material 138'.

Figure 3C:
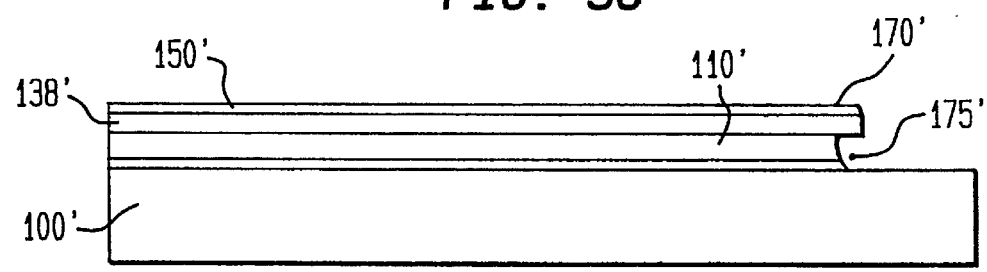

FIG. 3C shows the structure after the remaining portions of the photoresist 130' have been removed and the conductive sheet has been etched to leave individual leads 138' and terminals 170'. The etchant will also slightly subetch the conductive sheet at a point around the periphery of the lead material, shown at 175', and described above.

Figure 3D:
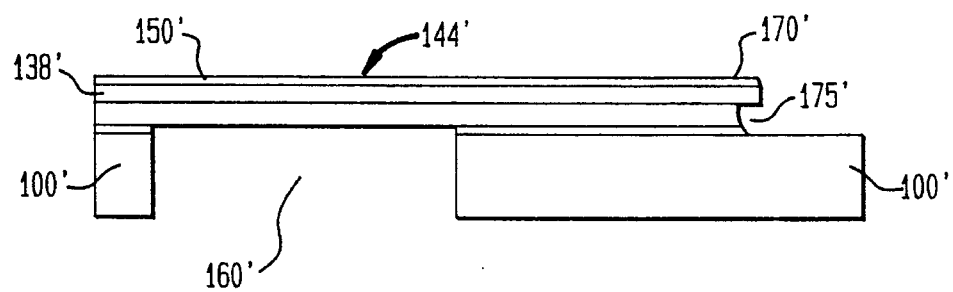

In FIG. 3D, portions of the dielectric layer 100' are removed to create the bonding window 160' such that each of the leads has a connection section which extends across the bonding window 160' and is secured on either side thereof. The bonding windows 160' may be created by $CO_2$/excimer laser etching with a carbon-dioxide or excimer laser or by chemically etching portions of the dielectric layer 160'.

Figure 3E:
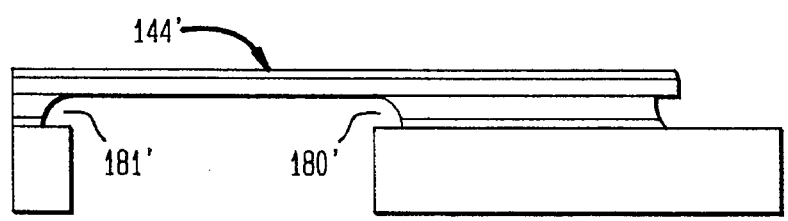

In FIG. 3E, the lead bearing side of the dielectric layer 100' is then protected, typically with a dielectric resist material, and the base material in conductive sheet 110' in the bond region 144' of each lead, within the bond window area 105' is etched with a suitable etchant. This etching step will sub-etch the conductive sheet material 110' past the boundary of the bonding windows 160' above the dielectric layer 100' providing removed areas at 180'/181'. The dielectric resist protectant is then removed from the lead side of the dielectric layer 100'. At this point, the bond region 144' of each lead extending across the bonding window 160' includes only the lead material 138' and optionally the gold flash 150' thereon.

Figure 3F:
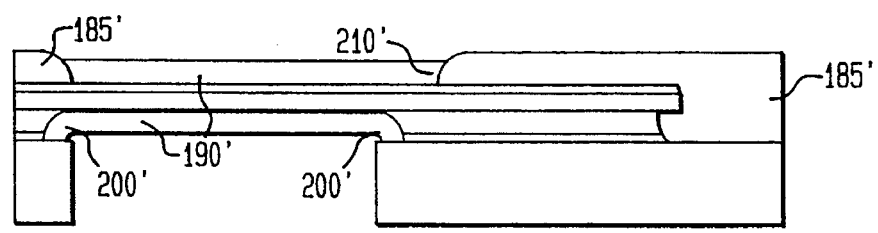

In FIG. 3F, the dielectric photo-resist 185' is selectively applied to the lead bearing surface of the dielectric layer 100' and the cover layer 190' is plated around the lead material 138' in the bond region 144' of each lead, within the bonding window 160', as described above. A cover layer overlap area 210' may extend past the boundary of the bonding window towards the lead's respective terminal 170' to relieve stress in the lead. The gold layer 190' may also be plated into both of the removed areas 180'/181' of the conductive sheet 110' (or just the removed area 180' closest to the respective terminal as shown in the previous embodiment) thereby forming the butt joint 200'. The butt joint and the overlap area perform the same functions as described above. The edge of the conductive sheet material 110' and terminal 170' may also be plated with gold or another protective metal so that the only remaining possible contamination path to the conductive sheet material is at the boundary of the gold layer 190' and the dielectric layer 100'.

Figure 3G:
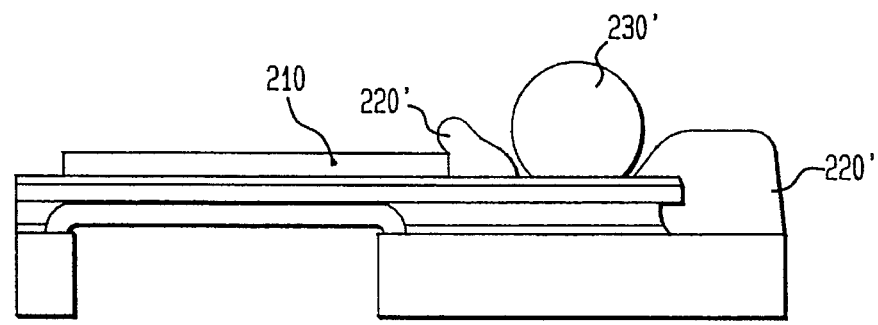

In FIG. 3G, a solder mask 220' is next typically applied to the lead bearing surface of the dielectric layer 100' to protect all but the interconnection means 230' (i.e. solder ball, plated bump, etc.) and the leads within the bonding window from electrical shorting and from corrosion. The solder mask is generally a screen printable, photo-imageable solder mask material which is imaged to allow the interconnection means 230' to make electrical contact with a respective terminal 170'.

In a further possible embodiment, after the lead and terminal areas are defined, a bottom layer of the cover material is first plated to a typical thickness of about 2 µm to 5 µm in at least the bond regions. A lead material (such as nickel) is then plated atop the bottom gold layer to a thickness of about 6 µm to 10 µm. A top cover layer is then plated atop the lead material to a typical thickness of 0.2 µm to 0.7 µm. If the bonding window was not created in the dielectric layer prior to lamination of the conductive sheet, the bonding window may be created by either a $CO_2$/ excimer laser or by chemical etching after the plating of the top gold layer. The conductive sheet may then be etched leaving the lead material/cover layer leads extending across the bonding window. A third cover layer (typically less than 0.1 µm thick) is then plated to cover the sides of the lead material and the exposed edges of the remaining conductive sheet material on the dielectric layer. In this arrangement, at least part of the cover layer is plated onto the lead material before the base material of the conductive sheet is etched beneath the bond regions.

As can be seen by the description of the foregoing embodiments, the lead material 138 is used primarily as a mandrel upon which to plate the outer layer of cover material 190 on the bond region of the lead, within the bonding window. Without the lead material 138, a pure gold lead could theoretically be used; however, the plating time to build-up the lead to the desired thickness is prohibitive on a TAB-like production line where the tape is pulled through plating tanks by a reel to reel system. A typical example of plating time to build-up a 25 μm pure gold lead is approximately 35 minutes. Using the lead material 138, the plating time is reduced to approximately 9 minutes to plate the lead material (for the example of nickel) and another 4 to 5 minutes to plate the cover layer 190 (for the example of gold). In other words, the effective plating time is dramatically reduced thereby allowing the leads to be formed in a TAB manufacturing line. Further, the reduced plating time avoids problems with the photo-resist material which tends to break down during exposure to hot cyanide baths typically used to electrodeposit gold.

As stated earlier, the lead material 138 must be able to support the bond region 144 of the lead within the bonding window, and yet maintain a certain amount of flexibility such that the lead may eventually be detached, bent downward and attached to a respective chip contact. After the cover layer 190 is plated therearound, the lead material 138 is typically disposed at or near a neutral stress zone of the lead such that the bending or flexing of the bond region due to detachment and bonding to the chip contact 160 puts little stress on or along the lengthwise axis of the lead material 138; thus, reducing the likelihood of causing cracks and other reliability problems in the leads. This can be especially important if a brittle material is used as the lead 138.

Figure 4:
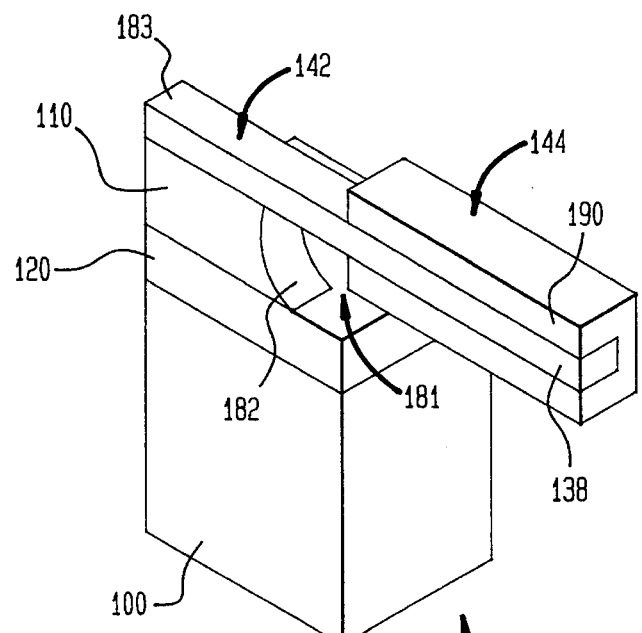
FIG. 4 shows a side view of a magnified portion of FIG. 2G showing a detachment area of the lead.

As pointed out above, a detachment area may be provided in the leads near the edge of the bonding window furthest from the respective terminal 170. In such an embodiment, a single point TAB bonder machine is preferably used to detach and align the lead and bond it to a respective chip contact on the face of the chip, as described below. Preferably, the detachment area is disposed at the end of the bond region 144 furthest from the respective terminal 170, and thus at the juncture of the bond region and the second end region 142 of the lead. As shown in FIG. 2G and in the corresponding magnified view in FIG. 4, the removed area 181 at the end of the bond region is devoid of the base metal 110 of the conductive sheet, and is also devoid of the cover material 190. Thus, the removed area is bridged only by the thin lead metal 138. Moreover, the base metal 110 is shaped by the subetching process to a fairly abrupt edge 182 at its juncture with the lead material. When a bonding tool applies a downward force on the lead, the edge 182 facilitate breakage of the lead.

Figure 5:
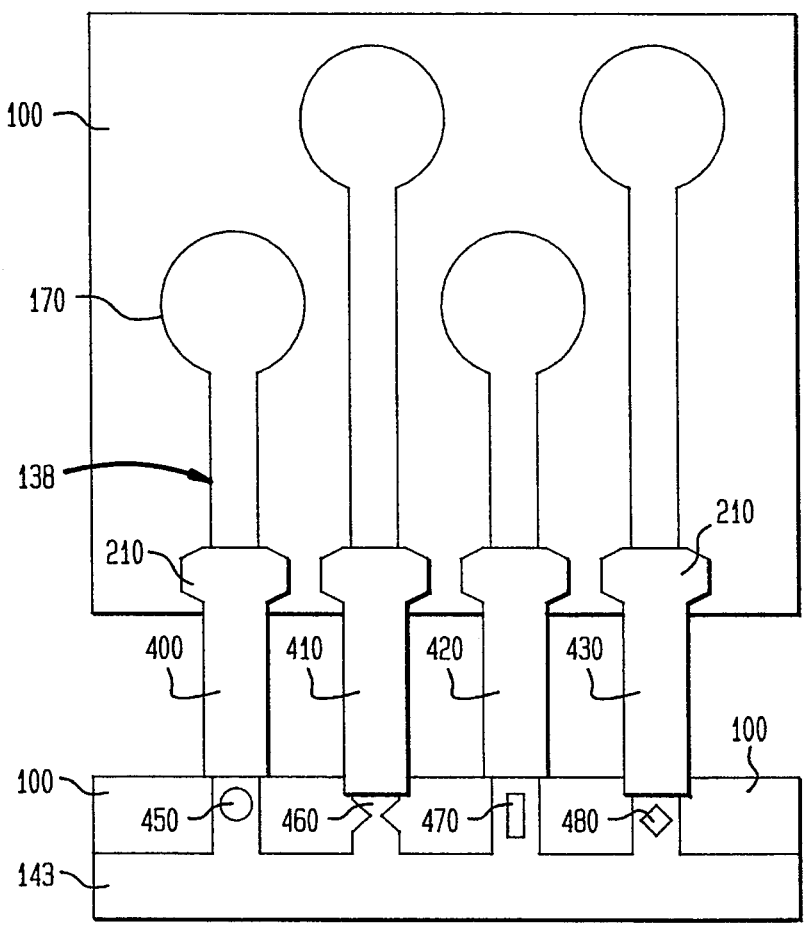
FIG. 5 shows a top view of several alternate lead detachment schemes, according to embodiments of to the present invention.

FIG. 5 shows detachment embodiments which may be used alone or in combination with the removed area 181 and edge 182, described above. Each such detachment area provides a weak and/or brittle portion of the lead. Several of the alternate leads (400, 410, 420, 430) shown in FIG. 5 have a detachment area which includes a portion of the lead in which the lead material has been removed or has been selectively plated such that there is a portion of the width of the lead does not have lead material plated thereon ("unplated regions") (450, 460, 470, 480). In these embodiments, the photoresist 185 (shown in FIG. 2F) covers the unplated regions during the plating of the cover layer so that these portions of the leads do not become covered. During the step of etching the conductive sheet, the conductive sheet beneath the detachment area will be etched away weakening the bond between the dielectric layer 100 and the lead. Further, the reduction in the lead material because of the detachment area weakens the lead itself so that it may break and be displaced downward into the bonding gap, as described below. It should be noted that the detachment area could also be within the bonding window. In a further example, the conductive bus 143 may be etched away thereby leaving the second end region of each lead, on the side of the bonding window remote from the terminal, secured to the dielectric layer by only its own adhesion. Stated another way, in this embodiment the second end region is not secured to the dielectric layer by the bus. The adhesion of the second end region provides only a weak attachment for each of the leads. In this embodiment, the leads do not break, they merely release from the dielectric layer 100 due to the downward force from the bonder tool.

In an embodiment where the package is no larger than the chip face itself (a chip-size or "fan-in" embodiment), all of the terminals 170 are located above, but remote from, the chip face. All of the leads in such an embodiment are connected together by a conductive bus 143, as shown in FIGS. 2 and 5. This bus is used to facilitate the plating operations, as described above.

The component fabricated according to the foregoing process can be utilized in connection methods as disclosed in commonly assigned International Patent Publication WO 94/03036. Thus, the connection component can be juxtaposed with a semiconductor chip so that rows of contacts on the semiconductor chip are aligned with the bonding windows of the dielectric layer 100. A bonding tool can be advanced to engage each lead within the bonding window, detach the lead, force it downwardly into the bonding window and bond the lead with to the appropriate contact on the face of the chip. As described in the '036 Publication, the bonding tool desirably brings each lead into more precise alignment with the chip contact. During the downward motion, the terminal side of the lead will remain attached to the dielectric layer 100, while the other end of the lead will be detached therefrom. As further disclosed in the '036 Publication, a compliant layer may be provided between the dielectric layer 100 and the chip to facilitate compensation for thermal expansion and also to facilitate moveability of the terminals 170 toward and away from the chip so that such vertical movement can compensate for irregularities and non-planarities during testing and assembly to other components. The completed assembly provides the benefits discussed in the '036 publication, including good compensation for thermal expansion. Such compensation is provided in part by flexure of the bonded leads. Because the leads are configured to be ductile and because the cover layer and the lead material do not form brittle intermetallic phases to any substantial extent, they will remain flexible and substantially fatigue-resistant. Further, because the cover material is selectively plated around the lead material only in the bond region and in adjacent regions, the amount of cover material required is substantially less than the amount that would be required if each lead was entirely made of the cover material. This is particularly significant where the cover material is a precious metal such as gold. Moreover, because the lead material is covered by the cover material, and the cover material makes the joints with the contacts it is possible to use lead materials which do not bond well to contacts. For example, shape memory alloys generally are difficult to bond, but give good fatigue resistance. However, when covered with a material such as gold, the bonding qualities of the shape memory alloy do not influence the bonding operation. To further enhance the fatigue resistance of the leads the bonded leads may be encapsulated in a compliant material, such as a silicone elastomer. Preferably, both the compliant layer and the encapsulant are made of the same material and are dispensed at the same time subsequent to the bonding of the leads to their respective contacts.

Figure 6A:
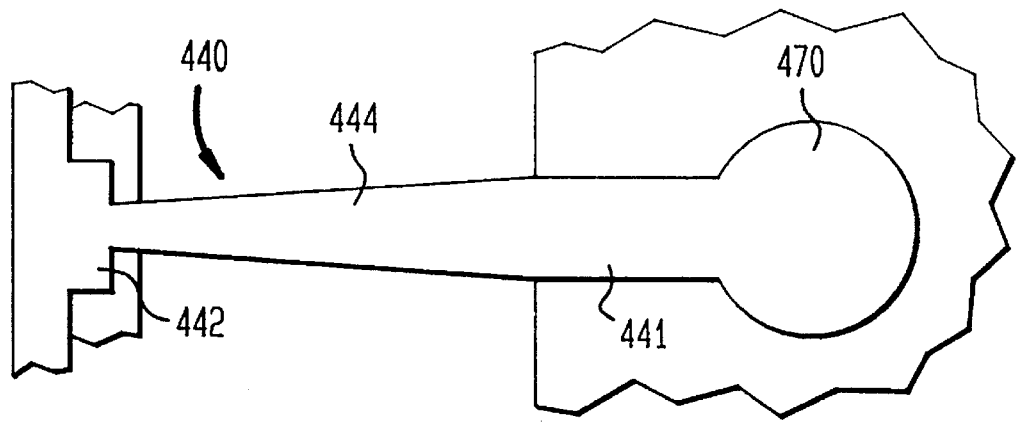
FIG. 6A through FIG. 6B show a top view of several alternative lead designs, according to further embodiments of the present invention.
Figure 6B:
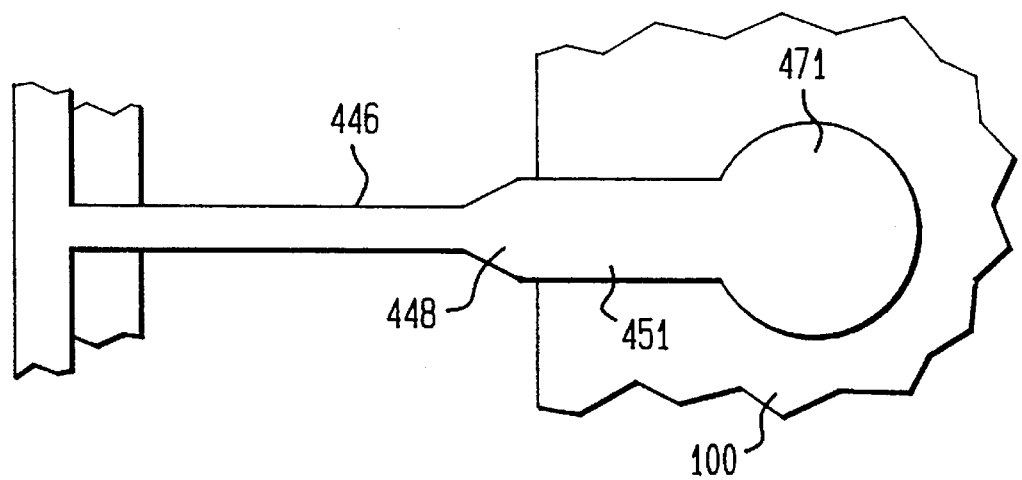

FIGS. 6A and 6B show several alternative lead embodiments where the thickness and the width of each lead over the bonding window 160 is controlled by tapering of the lead. The lead 440 may include a bond region 444 having a relatively large width at its juncture with the first end region 441 on the terminal side and gradually tapering to a relatively small width at the juncture between the bond region and the second end region 442, on the opposite side of the bonding window from the terminal 470 (as shown in FIG. 6A). Alternatively, the lead may have a widened "neck" portion 448 near the juncture of the bond region 446 and the first or terminal-side end region 451. Thus, the bond region 446 of the lead, within the bonding window is narrower than the first end region 451 extending over the dielectric layer to the terminal 471.(similarly shown at 210 in FIG. 2B). As the gold layer 190 is plated, the lead within the bonding window will get wider and thicker. However, because the lead is tapered, the gold layer will not make the resulting lead unduly wide or thick. Further, a wider portion of the lead at the boundary of the bonding window nearest the terminal will provide added stress relief during thermal cycling of the finished package.

Figure 7A:
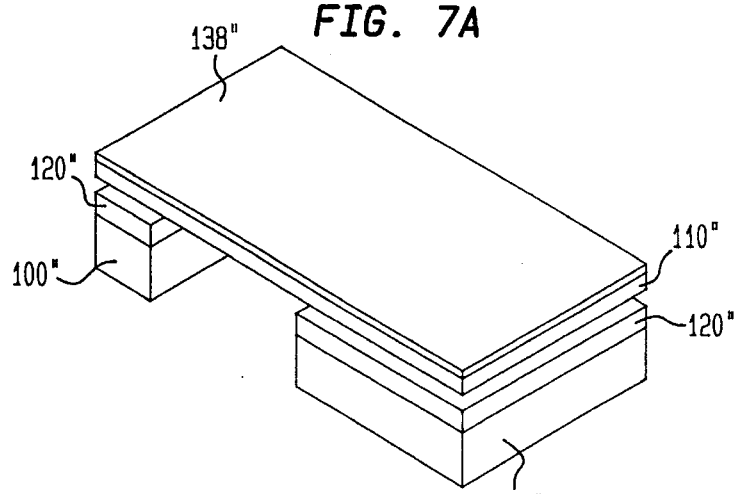
FIG. 7A through FIG. 7H are views similar to FIGS. 2A–G, but depicting a process in accordance with a further embodiment of the invention.
Figure 7B:
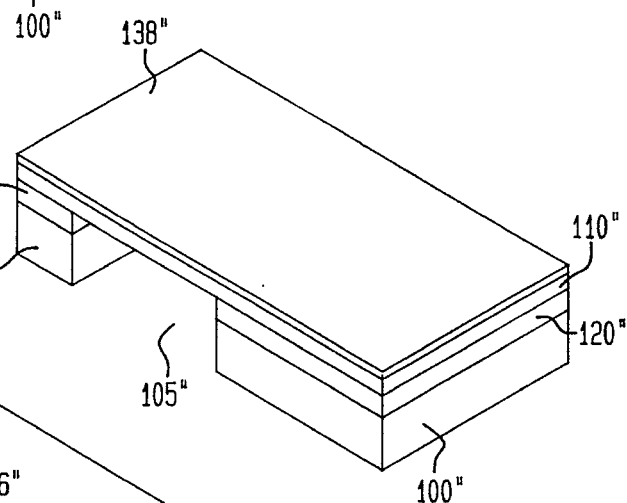

A method as illustrated in FIGS. 7A–7H is similar to the method described above with reference to FIGS. 2A–2G. In the method of FIGS. 7, the lead material 138" is provided as a continuous layer and then formed by a subtractive etching process. Thus, as seen in FIG. 7A and 7B, a continuous layer of the material 138" is provided on the top surface of the base conductive layer 110", which in turn is secured to the top surface of dielectric layer 100" by an adhesive layer 120". The conductive base material sheet 110" and the lead material layer 138" extend over a bond window 105". As discussed above, the bond window may be formed either before or after the conductive layers 110" and 138" are applied and either before or after the leads are formed in the steps discussed below. Also, the lead material may be placed on the conductive or base metal sheet 110" either before or after the base metal sheet is applied to the dielectric layer. For example, the lead material may be plated onto the base material layer. Alternatively, the lead material may be sputtered onto the base material layer or formed as a separate sheet which is then laminated to the base material layer. In a further variant, the base material may be deposited onto a preformed sheet of the lead material as, for example, by plating or sputtering the base material on a continuous sheet of the lead material. The ability to use preformed sheets of the lead material is particularly advantageous where the lead material cannot be plated readily or where a desirable crystal structure or hardness in the lead material cannot be imparted by plating. For example, it is difficult to deposit certain shape memory alloys with uniform properties by plating the shape memory alloy. Such alloys can be processed most efficiently as preformed sheets.

Figure 7C:
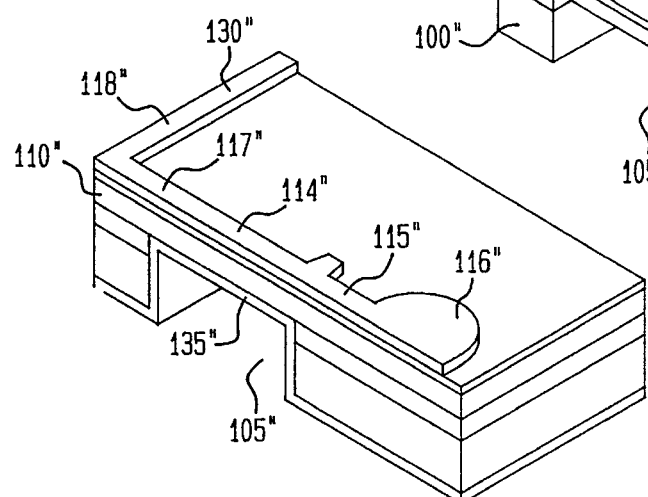
Figure 7D:
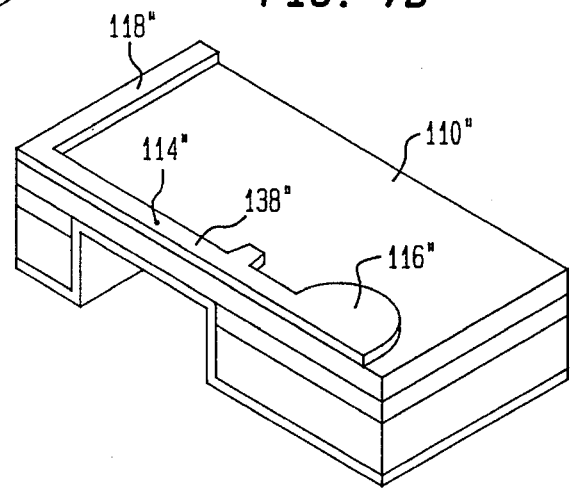
Figure 7E:
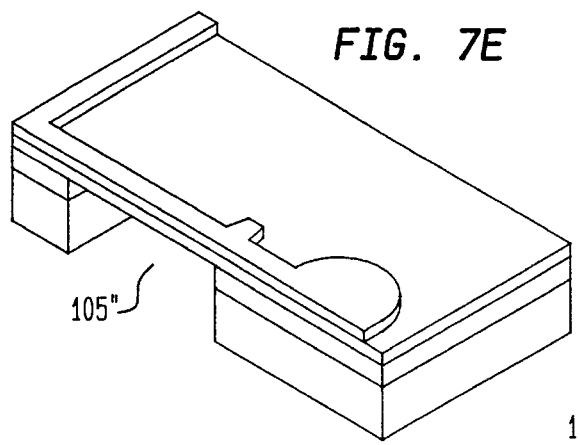
Figure 7F:
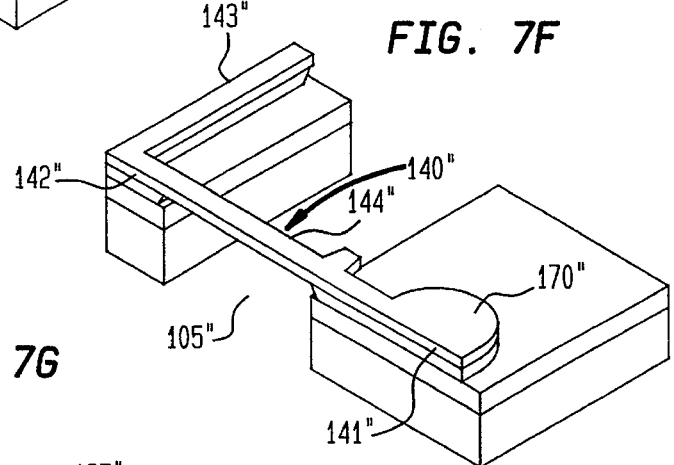
Figure 7G:
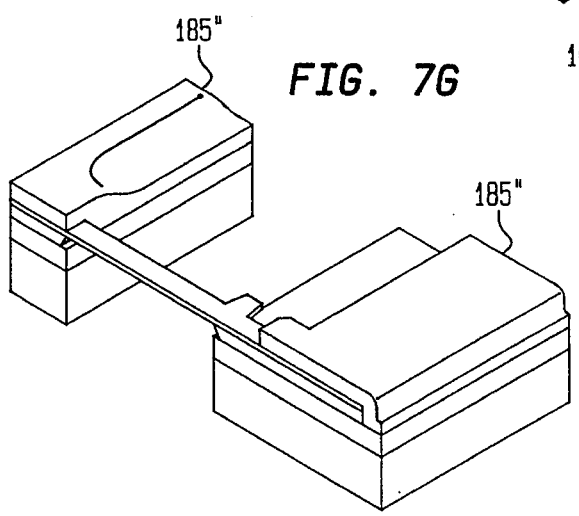
Figure 7H:
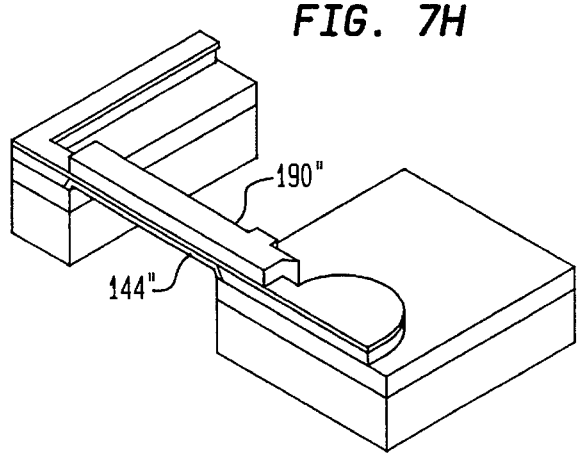

After assembly of the base material sheet and lead material sheet to the dielectric layer, a bottom photoresist 135" is applied to cover the exposed surface of the base material sheet 110" in the bonding window 105" as described above with reference to FIG. 2, and a top photoresist 130" is applied and selectively patterned as shown in FIG. 7C. Resist 130" is selectively developed and selectively removed to leave the pattern seen in FIG. 7C, in which the resist covers only those areas where the lead material is to remain. Thus, the top resist 130" covers the terminal areas 116", first bond region area 114" and first and second end regions 115" and 117", as well as the bus region 118". The assembly is immersed in an etchant solution which will attack the lead metal 138" and the lead metal is removed in all of the regions except those regions covered by the top resist 130", and the resist 130" is then removed by a stripping solution. This leaves the lead metal 138" in substantially the same configuration as shown above with reference to FIG. 2. Thus, the lead metal is present as an elongated strip extending through the bond region 114" aligned with the bonding window 105". It is also present in the terminal areas 116", the bus region 118" and the first and second end regions connecting each bond region 114" with a terminal area and with a bus. The initial etching step used to form the lead material to the configuration of FIG. 7D may also remove some of the base metal 110" in the areas not covered by the lead metal. However, some of the base metal typically remains.

In the next phase of the process, the bottom resist is removed, and the assembly is subjected to further etching in an etchant which will etch the base metal rapidly but which will not rapidly etch the lead metal. For example, where the lead metal is nickel, a solution of FeCl and HCl under relatively severe conditions may be used to etch the lead metal, whereas a solution of CuCl and HCl under less severe conditions may be used to etch the dismantled layer 110. In the manner discussed above with reference to FIG. 2E, etching of the base metal removes the base metal beneath the bond regions aligned with the bonding window, leaving a composite lead 140" having a bond region 144" consisting essentially of the lead metal bridging over the bonding window 105", whereas the regions 141 and 142 of the lead include some of the base metal and extend from the bond region to a plating bus 143" and to terminals 170". In the manner discussed above with reference to FIG. 2, a further resist 185" is applied to the portions of each lead remote from the bond window and to the terminals and bus and the assembly is then plated with the cover layer so as to plate the cover layer 190" onto the bond region 144" of each lead.

Numerous further variations and combinations of the features discussed above can be utilized without departing from the present invention as defined by the claims. For example, the terminals and buses can be formed in separate operations, with separate masking, etching and plating step either before or after the bond or before or after the cover layer is applied on the bond region. Also, as discussed above, the cover layer can be applied to the bond region before the base material is etched.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of fabricating leads on a flexible dielectric layer having first and second major surfaces, the first major surface of the dielectric layer further having a sheet of a conductive base material attached thereto, the method comprising the steps of:

providing elongated strips of a lead material on said sheet of base material;

etching the base material sheet after providing said strips so as to remove said base material from beneath said strips of lead material in a bond region of each said strip but leave each said strip attached to said base material at opposite ends of each such bond region; and plating a layer of a cover material onto each said strip of lead material in the bond region of such strip.

2. The method as claimed in claim 1 wherein said step of providing said strips includes the step of providing a sheet of said lead material overlying said conductive sheet and selectively etching said sheet of lead material.

3. The method as claimed in claim 1 wherein said step of providing said strips includes the steps selectively depositing said lead material in defined lead areas on said sheet of conductive material.

4. The method as claimed in claim 1, wherein the lead material acts as an etch mask in the step of etching the conductive sheet.

5. The method as claimed in claim 1, further comprising the step of providing a bonding window extending through said dielectric sheet from said first major surface to said second major surface in registration with said bond regions of said strips prior to said step of etching said sheet of base material.

6. The method as claimed in claim 5 wherein said bonding window is provided before said sheet of base material is attached to said dielectric layer and before said strips are formed, said strips being formed in registration with said bonding window.

7. The method as claimed in claim 6, wherein a portion of the dielectric layer is removed to create the bonding window subsequent to the attachment of the conductive sheet.

8. The method as claimed in claim 5, wherein the step of etching the conductive sheet includes sub-etching a portion of the sheet between the dielectric layer and the lead material such that at least one removed area devoid of said base material is provided between each strip of lead material and the dielectric sheet adjacent the bonding window.

9. The method as claimed in claim 8, wherein the step of plating said cover layer on said strips further includes providing the cover layer within at least one removed area for each said strip.

10. The method as in claim 1 wherein said cover material includes a metal selected from the group consisting of gold, silver, platinum, palladium, and alloys and combinations thereof.

11. The method as claimed in claim 9 wherein said cover material consists essentially of gold.

12. The method as claimed in claim 1 or claim 10 or claim 11, wherein said lead material is comprised of a metal selected from the group consisting of nickel, palladium, titanium, nickel, cobalt, chromium, gold, zinc and alloys and combinations thereof.

13. The method as claimed in claim 12 wherein said metal of said lead material consists essentially of a metal selected from the group consisting of nickel, nickel-palladium alloys, nickel-titanium alloys, gold, gold-chromium alloys, and palladium.

14. The method as claimed in claim 1 or claim 10 or claim 11 wherein said lead material is a shape memory alloy.

15. The method as claimed in claim 14 wherein said shape memory alloy consists essentially of an alloy of nickel and titanium.

16. The method as claimed in claim 1, wherein step of providing the lead material includes providing the lead material in a thickness of about 5 μm to 10 μm.

17. The method as claimed in claim 1, wherein the step of plating a cover layer includes selectively plating the cover layer on each said strip to a thickness of about 2 μm to 5 μm.

18. The method as claimed in claim 1, wherein said step of providing said lead material includes the step of providing a first portion of the lead material within a terminal area for each said strip and a second portion of the lead material in a first end area extending between the bond region of the strip and the terminal area, said lead material in each said terminal area and first end area protecting said base metal of said sheet during said step of etching said sheet to thereby form a terminal and first end including said base metal and said lead metal electrically connected to the bond region of each said strip.

19. The method as claimed in claim 18, further comprising plating a flash of gold atop the lead material.

20. The method as claimed in claim 18, wherein said step of plating said cover layer on the bond region of each said strip is performed so as to plate said cover layer selectively on the bond region of each strip and optionally on one or more portions of each strip adjacent the bond region.

21. The method as claimed in claim 20 wherein the step of selectively plating the cover layer further includes providing an overlap portion of the cover layer extending toward the terminal area from the bonding window.

22. The method as claimed in claim 18, wherein the step of providing said strips includes providing said strips so that each said strip tapers from a relatively large width at the side of the bonding window adjacent the terminal area to a relatively small width at the other side of the bonding window.

23. The method as claimed in claim 18, wherein the step of providing said strips includes providing each said strip with a widened neck portion about the boundary of the bonding window nearest the terminal area.

24. The method as claimed in claim 1, wherein said steps of plating said cover layer and etching said base material sheet are performed so as to create a frangible detachment area substantially devoid of said cover material and said base material at one end of each said bond region, each such end of a bond region being connected to said dielectric sheet through the frangible detactment area, whereby each such end of the bond region may be separated from the dielectric layer by breaking the detachment area.

25. The method as claimed in claim 1, further comprising providing an area of the lead material weakly attached to the dielectric layer adjacent one end of each said bond region such that the end of the bond region may be separated from the dielectric layer by separating said weakly attached area.

26. The method as claimed in claim 1, further comprising providing a weak point in the lead material adjacent one end of each said bond region so that the end of the bond region may be detached from the dielectric layer by breaking said weak point.

27. The method as claimed in claim 1, wherein the steps of providing the lead material and selectively providing the cover layer include plating the lead material and the cover layer using a conductive bus.

* * * * *

UNITED STATES PATENT AND TRADEMARK OFFICE
CERTIFICATE OF CORRECTION

PATENT NO. : 5,597,470
DATED : January 28, 1997
INVENTOR(S) : Karavakis et al.

It is certified that error appears in the above-indentified patent and that said Letters Patent is hereby corrected as shown below:

On the title page, item [22], change "Jun. 18, 1995" to --Jun. 19, 1995--.

Signed and Sealed this

Thirteenth Day of May, 1997

Attest:

BRUCE LEHMAN

Attesting Officer

Commissioner of Patents and Trademarks